(12) United States Patent
Makabe et al.

(10) Patent No.: US 9,410,753 B2
(45) Date of Patent: Aug. 9, 2016

(54) SUBSTRATE TEMPERATURE ADJUSTING METHOD AND A METHOD OF CHANGING THE TEMPERATURE CONTROL RANGE OF A HEATER IN A SUBSTRATE PROCESSING APPARATUS

(71) Applicant: TOKYO ELECTRON LIMITED, Tokyo (JP)

(72) Inventors: Toshiyuki Makabe, Miyagi (JP); Taketoshi Okajo, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 580 days.

(21) Appl. No.: 13/772,467

(22) Filed: Feb. 21, 2013

(65) Prior Publication Data

US 2013/0228323 A1 Sep. 5, 2013

Related U.S. Application Data

(60) Provisional application No. 61/606,079, filed on Mar. 2, 2012.

(30) Foreign Application Priority Data

Feb. 21, 2012 (JP) ................................. 2012-035308

(51) Int. Cl.
*F28F 27/00* (2006.01)
*F28F 27/02* (2006.01)
*H01L 21/67* (2006.01)

(52) U.S. Cl.
CPC .......... *F28F 27/02* (2013.01); *H01L 21/67109* (2013.01)

(58) Field of Classification Search
CPC ........................... F28F 27/02; H01L 21/67109
USPC .................................................. 165/200, 201
See application file for complete search history.

(56) References Cited

U.S. PATENT DOCUMENTS

| | | | |
|---|---|---|---|
| 9,103,598 B2 * | 8/2015 | Bellenfant | ............ F28D 1/0408 |
| 9,299,595 B2 * | 3/2016 | Dunn | ................ H01L 21/67103 |
| 2006/0005930 A1 * | 1/2006 | Ikeda | ................. H01J 37/32431 |
| | | | 156/345.51 |
| 2006/0027169 A1 | 2/2006 | Tsukamoto et al. | |
| 2006/0207725 A1 * | 9/2006 | Oohashi | ............ H01J 37/32724 |
| | | | 156/345.53 |
| 2007/0275183 A1 * | 11/2007 | Hashimoto | ............. B29C 55/06 |
| | | | 428/1.2 |
| 2008/0083724 A1 | 4/2008 | Tsukamoto | |
| 2009/0118872 A1 | 5/2009 | Nonaka et al. | |

(Continued)

FOREIGN PATENT DOCUMENTS

JP 7-335732 A 12/1995
JP 2008-34409 A 2/2008

(Continued)

*Primary Examiner* — Ljiljana Ciric
(74) *Attorney, Agent, or Firm* — Rothwell, Figg, Ernst & Manbeck, P.C.

(57) ABSTRACT

A method which changes the temperature control range of a heater of a substrate processing apparatus. The temperature control range of a heater is changed or extended by changing the flow rate of the coolant flowing through a coolant channel from a first flow rate to a second flow rate which is smaller than the first flow rate, to change a first thermal conductivity of a mounting table to a second thermal conductivity which is smaller than the first thermal conductivity. The upper limit of the temperature control range is lower than the heat resistant temperature of a material of an adhesive of the mounting table.

4 Claims, 14 Drawing Sheets

(56) References Cited

U.S. PATENT DOCUMENTS

| | | | | |
|---|---|---|---|---|
| 2009/0223932 A1* | 9/2009 | Hida | .................. | H01J 37/32009<br>216/67 |
| 2010/0096109 A1* | 4/2010 | Zhang | ............... | H01J 37/32724<br>165/104.19 |
| 2010/0118464 A1* | 5/2010 | Matsuyama | ........ | H01L 21/6833<br>361/234 |
| 2010/0224355 A1* | 9/2010 | Iwasaki | .............. | G05D 23/1902<br>165/201 |
| 2013/0023120 A1* | 1/2013 | Yaegashi | ........... | H01J 37/32091<br>438/689 |
| 2013/0228323 A1* | 9/2013 | Makabe | .................. | F28F 27/02<br>165/201 |
| 2014/0231389 A1* | 8/2014 | Nagami | ............ | H01J 37/32091<br>216/67 |
| 2014/0311728 A1* | 10/2014 | Nonaka | ............. | H01L 21/67109<br>165/296 |
| 2015/0364318 A1* | 12/2015 | Hirose | .................... | C23C 16/36<br>438/763 |
| 2015/0364350 A1* | 12/2015 | White | ................. | C23C 16/4586<br>156/345.33 |

FOREIGN PATENT DOCUMENTS

| | | |
|---|---|---|
| JP | 2008-509553 A | 3/2008 |
| JP | 2008-85329 A | 4/2008 |
| JP | 2009-117443 A | 5/2009 |
| JP | 2011-529273 A | 12/2011 |
| WO | 2010/011521 A2 | 1/2010 |

* cited by examiner

SUBSTRATE TEMPERATURE ADJUSTING METHOD AND A METHOD OF CHANGING THE TEMPERATURE CONTROL RANGE OF A HEATER IN A SUBSTRATE PROCESSING APPARATUS

CROSS-REFERENCE TO RELATED APPLICATION

This application claims priority to Japanese Patent Application No. 2012-035308 filed on Feb. 21, 2012 and U.S. Provisional Application No. 61/606,079 filed on Mar. 2, 2012, the entire contents of which are incorporated herein by reference.

FIELD OF THE INVENTION

The present invention relates to a substrate processing apparatus, a substrate processing method and a method of changing substrate temperature setting region.

BACKGROUND OF THE INVENTION

A substrate processing apparatus generally includes a processing chamber capable of maintaining a vacuum environment, and a mounting table arranged in the interior (processing space) of the processing chamber for mounting a substrate thereon to thereby perform plasma processing or the like onto the substrate by supplying an RF power to the processing chamber. The mounting table is used to fulfill a temperature control function for setting a substrate at a predetermined temperature as well as a substrate supporting function to support the substrate in the processing chamber and a power supply function as an RF electrode.

The apparatus described in Japanese Patent Publication No. 2008-85329 (Patent Document 1) includes: an electrostatic chuck having a substrate supporting surface; a support base attached to the bottom surface of the electrostatic chuck with an adhesive; and a temperature control system. The electrostatic chuck has a center heating unit and an edge heating unit therein. The center heating unit is positioned below the central portion of the substrate supporting surface and the edge heating unit is positioned below the edge portion of the substrate supporting surface. Further, the support base has a cooling unit therein. The center heating unit, the edge heating unit and the cooling unit are controlled by the temperature control system so that the substrate temperature can be controlled to be maintained at a specific temperature. The electrostatic chuck and the support base are formed with ceramic and aluminum, respectively.

The apparatus described in Japanese Patent Application Publication No. 209-117443 (Patent Document 2) includes a support base in which dual circulation paths of heat transfer medium are provided, and a temperature control unit for supplying a heat transfer medium to each of the dual circulation paths. One circulation path is formed in a central portion of the support base and the other circulation path is formed in a side portion of the support base.

The temperature control unit has a heating unit for heating the heat transfer medium, a cooling unit for cooling the heat transfer medium and a bypass channel for making the heat transfer medium bypass the heating unit and the cooling unit. Heat transfer media discharged from exits of the respective circulation paths are supplied into the temperature control unit to be supplied into the heating unit, the cooling unit or the bypass channel. Further, flow rate control valves are provided at entrances of the respective circulation paths. The flow rate control valves allow the heat transfer media supplied from the heating unit, the cooling unit and the bypass channel to join together. With this configuration, the temperature-controlled heat transfer medium and the circulated heat transfer medium are joined to be a heat transfer medium at a predetermined temperature which is supplied into each of the circulation paths.

The apparatus described in Japanese Patent Application Publication No. 2008-509553 (Patent Document 3) includes a support base in which dual circulation paths of heat transfer medium are provided. One circulation path is provided in the first heating zone positioned at a central portion of the support base and the other circulation path is provided in a second heating zone positioned at a side portion of the support base. Since each of the circulation paths is independently connected with a heat exchanger, the circulating speed (flow rate) or the temperature of the heat transfer medium, or the combination thereof is controlled, and thus, the temperature of the substrate can be set at a predetermined level.

Patent Document 1: Japanese Patent Application Publication No. 2008-85329
Patent Document 2: Japanese Patent Application Publication No. 2009-117443
Patent Document 3: Japanese Patent Application Publication No. 2008-509553

The mounting table described in Patent Document 1 has a laminated structure configured with a plurality of members stacked by using an adhesive so that the substrate supporting function, the power supply function and the temperature control function can be achieved.

In order to stably maintain an adhesive strength, the adhesive for attaching the members is heat resistant. Accordingly, when a vicinity temperature around adhesive becomes equal to or greater than the heat resistant temperature of the adhesive, the adhesive strength deteriorates, and thus, the attached members may become detached. Further, in a case where a thermal conductivity as a physical property of each member is remarkably low, heat transferring is interrupted, and thus, a temperature control range of the substrate may not be satisfied. Furthermore, each cooling unit described in Patent Documents 1 to 3 has a limit to its cooling capacity, i.e., an amount of heat taken away from the substrate per unit time. Therefore, cooling control cannot be executed at a temperature higher than a cooling temperature limit of the cooling unit.

As described above, the temperature control range of the substrate, which is set by the temperature control function of electrostatic chuck, is limited by the physical properties of the configuration members of the electrostatic chuck and the adhesive material, and the cooling capacity of the cooling unit.

SUMMARY OF THE INVENTION

In view of the above, the present invention provides a substrate processing apparatus capable of extending a limit of a temperature control range of a substrate with a simple structure.

In accordance with an aspect of the present invention, there is provided a substrate processing apparatus including a processing chamber, a mounting table, a chiller, a first channel, a second channel, a bypass channel and a flow rate control valve. The processing chamber includes a processing space. The mounting table includes a support base and an electrostatic chuck. The support base is provided with a coolant channel having an entrance and an exit. The electrostatic chuck is attached to the support base with an adhesive and is provided with one or more heaters disposed inside the electrostatic chuck or at a bottom surface thereof. The chiller includes a main body configured to control a temperature of a coolant to be lower than a temperature at which a cooling capacity of the chiller is saturated and a pump configured to circulate the coolant. The first channel which connects the chiller and the entrance and the second channel connects the chiller and the exit. The bypass channel branches from a midway of the first channel and is connected to a midway of the second channel. The flow rate control valve is configured to control a flow rate of the coolant flowing through the bypass channel.

In the substrate processing apparatus, the first channel connecting the chiller and the entrance of the coolant channel and the second channel connecting the chiller and the exit of the coolant channel are connected with the bypass channel, and thus, the flow rate of the coolant flowing through the bypass channel is controlled by the flow rate control valve. That is, the flow rate of the coolant flowing through the bypass channel is adjusted by the flow rate control valve. By changing the flow rate of the coolant in this way, the thermal conductivity of the mounting table can be changed. For example, when the thermal conductivity of the mounting table is changed to be small, a temperature control range of the heater under a heat resistant temperature of an adhesive is avoided from being limited by the cooling capacity of the chiller. Thus, the limit to the temperature control range of the substrate can be extended with a simple configuration.

In accordance with the first aspect, the pump may circulate the coolant at a constant first flow rate, and the flow rate control valve may be configured to allow the coolant to flow through the coolant channel at a second flow rate, which is smaller than the first flow rate, by flowing the coolant through the bypass channel. With this configuration, the thermal conductivity of the mounting table is changed only by the valve control without deteriorating the cooling capacity of the chiller.

In accordance with the first aspect, the substrate processing apparatus further includes a gas supply unit, a first electrode, a power supply and a controller. The gas supply unit is configured to supply a processing gas into the processing space. The first electrode is provided in the processing space, a power supply is configured to apply a voltage between the first electrode and the support base serving as a second electrode, and the controller is configured to control the flow rate control valve. The controller may control the flow rate of the coolant flowing through the bypass channel based on a coolant temperature during a process, a power applied from the power supply and a target temperature of the substrate. With this configuration, the flow rate of the coolant flowing through the bypass channel is controlled to obtain a target temperature of the substrate of which temperature is determined based on the coolant temperature and the power applied from the power supply.

In accordance with the first aspect, the controller may be connected to the heaters to control heat emission rates of the heaters based on the flow rate of the coolant flowing through the bypass channel and the target temperature of the substrate. With this configuration, the heaters can be controlled within the temperature control range of the heaters which depends on the flow rate of the coolant flowing through the bypass channel.

In accordance with the first aspect, the electrostatic chuck may include a substrate supporting surface configured to support the substrate and a focus ring supporting surface formed around the substrate supporting surface, and the heaters and the coolant are preferably configured to control temperatures of the substrate supporting surface and the focus ring supporting surface. With this configuration, the temperature difference between the substrate and the focus ring can be controlled as desired.

In accordance with the first aspect, the heaters may include a heater disposed under the substrate supporting surface and a heater disposed under the focus ring supporting surface. A thickness structure including the heater, disposed under the substrate supporting surface, through the support base, and a thickness structure including the heater, disposed under the focus ring supporting surface, through the support base are preferably identical. With this configuration, lower structures of the substrate and the focus ring are substantially same, and thus, the thermal conductivity in the mounting table may be uniform.

In accordance with another aspect of the present invention, a substrate processing method uses a substrate processing apparatus. The substrate processing apparatus includes a processing chamber, a mounting table, a chiller, a first channel, a second channel, a bypass channel and a flow rate control valve. The processing chamber includes a processing space. The mounting table includes a support base and an electrostatic chuck. The support base provided with a coolant channel having an entrance and an exit and the electrostatic chuck is attached to the support base with an adhesive and is provided with a heater disposed inside the electrostatic chuck or at a bottom surface thereof.

The chiller includes a main body configured to control a temperature of a coolant to be lower than a temperature at which a cooling capacity of the chiller is saturated and a pump configured to circulate the coolant. The first channel connects the chiller and the entrance and a second channel connects the chiller and the exit. The bypass channel branches from a midway of the first channel and is connected to a midway of the second channel. The flow rate control valve is configured to control a flow rate of the coolant flowing through the bypass channel. The substrate processing method includes changing a flow rate of the coolant flowing through the support base from a first flow rate to a second flow rate which is smaller than the first flow rate by controlling the flow rate control valve when increasing a temperature of the substrate.

In the substrate processing method, the flow rate of the coolant flowing through the support base is changed from a first flow rate to a second flow rate which is smaller than the first flow rate by controlling the flow rage control valve when increasing the substrate temperature, thereby changing a first thermal conductivity of the mounting table to a second thermal conductivity which is smaller than the first thermal conductivity and extending the setting region of the substrate temperature set by the heater, under a heat resistant temperature of a material of the adhesive. Accordingly, e.g., when the substrate temperature is increased in stages for each process, the thermal conductivity of the mounting table is changed so that different target temperatures of the substrate for each process can be controlled to be within the substrate temperature setting region. Thus, the limit to the substrate temperature setting region can be extended with a simple structure.

In accordance with still another aspect of the present invention, there is provided a method of changing substrate temperature setting region using a substrate processing apparatus. The substrate processing apparatus includes a processing chamber, a mounting table and a chiller. The processing chamber includes a processing space. The mounting table includes a support base and an electrostatic chuck. The support base is provided with a coolant channel having an entrance and an exit and the electrostatic chuck is attached to the support base with an adhesive and is provided with a heater disposed inside the electrostatic chuck or at a bottom surface thereof. The chiller includes a main body configured to control a temperature of a coolant to be lower than a temperature at which a cooling capacity of the chiller is saturated and a pump configured to circulate the coolant.

The method includes changing a flow rate of the coolant flowing through the support base from a first flow rate to a second flow rate which is smaller than the first flow rate to change a first thermal conductivity of the mounting table to a second thermal conductivity which is smaller than the first thermal conductivity, thereby extending the setting region of the substrate temperature set by the heater, under a heat resistant temperature of a material of the adhesive.

In the method of changing substrate temperature setting region, the flow rate of the coolant flowing through the support base is changed from the first flow rate to the second flow rate which is smaller than the first flow rate, thereby changing the first thermal conductivity of the mounting table to the second thermal conductivity which is smaller than the first thermal conductivity and extending the setting region of the substrate temperature set by the heater, under a heat resistant temperature of a material of the adhesive. Accordingly, e.g., the thermal conductivity of the mounting table is changed in each process so that different target temperatures of the substrate for each process can be controlled to be within the substrate temperature setting region, or a target substrate temperature required in the apparatus can be flexibly obtained without changing the configuration of the apparatus. Thus, the limit to the substrate temperature setting region can be extended with a simple structure.

In accordance with the aspects of the present invention, the limit to the temperature control range of the substrate can be extended with the simple structure.

BRIEF DESCRIPTION OF THE DRAWINGS

The objects and features of the present invention will become apparent from the following description of embodiments, given in conjunction with the accompanying drawings, in which:

FIGS. 4A and 4B show graphs presenting temperature differences at a center and an edge of a substrate, and a focus ring, wherein FIG. 4A is a graph with respect to a mounting table shown in FIG. 1 and FIG. 4B is a graph with respect to a mounting table in a prior art;

FIGS. 9A and 9B are graphs presenting temperature control ranges of heater, wherein FIG. 9A is for a case where a thermal conductivity of the mounting table is set to 500 $(W/m^2 \cdot K)$ and FIG. 9B is for a case where a thermal conductivity of the mounting table is set to 240 $(W/m^2 \cdot K)$;

DETAILED DESCRIPTION OF THE EMBODIMENTS

Hereinafter, an embodiment of the present invention will be described with reference to the accompanying drawings which form a part hereof. Throughout the drawings, identical or corresponding portions will be designated by like reference symbols without description thereof.

Figure 1:
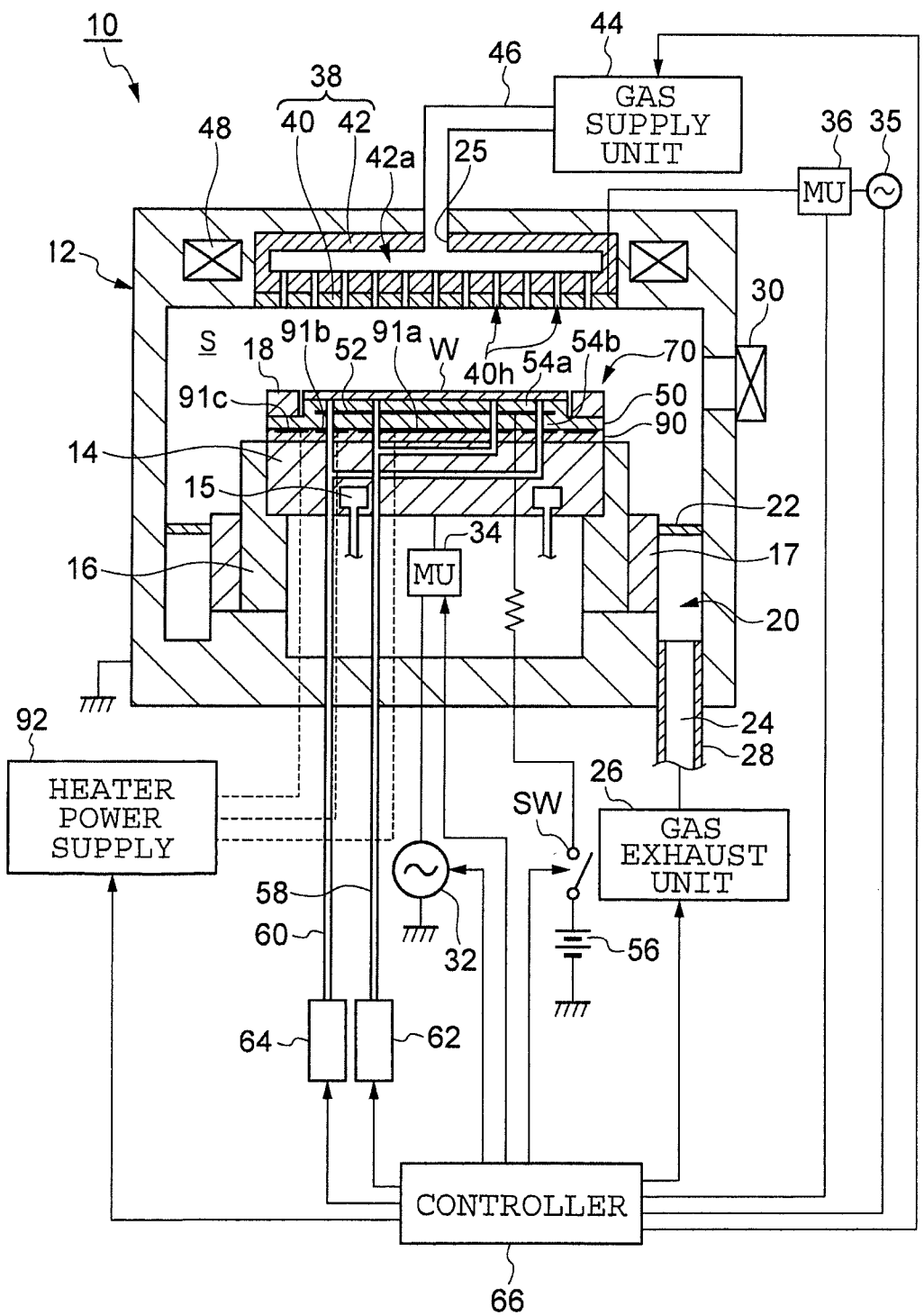
FIG. 1 is a view schematically showing a substrate processing apparatus in accordance with an embodiment.

FIG. 1 is a view schematically showing a plasma processing apparatus in accordance with an embodiment. In FIG. 1, the cross section of the plasma processing apparatus in accordance with the present embodiment is shown. The plasma processing apparatus 10 in FIG. 1 is a parallel plate type.

The plasma processing apparatus 10 includes a processing chamber 12. The processing chamber 12 is formed in a substantially cylindrical shape whose inner space is a processing space S. The plasma processing apparatus 10 includes a support base 14, which is formed in a substantially circular plate shape, in the processing chamber 12. The support base 14 is made of, e.g., aluminum and is provided at a lower portion in the processing space S to serve as a second electrode (lower electrode). The support base 14 radiates heat from an electrostatic chuck 50, which will be later described, in a process to cool the electrostatic chuck 50.

In the interior of the support base 14, a coolant channel 15 is formed. An entrance and an exit of the coolant channel 15 are respectively connected with a coolant inlet line and a coolant outlet line, and thus, a coolant is supplied into the coolant channel 15 by a chiller (cooling unit). By circulating a suitable coolant, e.g., cooling water or the like in the coolant channel 15, temperatures of the support base 14 and the electrostatic chuck 15 can be controlled at predetermined levels.

In accordance with the present embodiment, the plasma processing apparatus 10 includes a cylindrical sustaining member 16 and a cylindrical support 17. The cylindrical sustaining member 16 contacts with a side surface and a peripheral portion of a bottom surface of the support base 14, thereby sustaining the support base 14. The cylindrical support 17 extends from the bottom portion of the processing chamber 12 in a vertical direction and supports the support base 14 via the cylindrical sustaining member 16.

In accordance with the present embodiment, a gas exhaust path 20 is formed between a side wall of the processing chamber 12 and the cylindrical support 17. A baffle plate 22 is attached in the gas exhaust path 20 or at an entrance thereof, and a gas exhaust port 24 is provided at a bottom portion of the gas exhaust path 20. The gas exhaust port 24 is formed with a gas exhaust pipe 28 which is inserted into a bottom portion of the processing chamber 12 and is connected with a gas exhaust unit 26. The gas exhaust unit 26 has a vacuum pump so that the processing space S in the processing chamber 12 is depressurized to a predetermined vacuum degree. A gate valve 30 for opening and closing a loading/unloading port of a wafer W (substrate) is attached to the side wall of the processing chamber 12.

A high frequency power supply 32 for plasma generation is electrically connected to the support base 14 via a matching unit (MU) 34 to apply a high frequency power of a predetermined high frequency (e.g., 27 MHz or higher) to the second electrode, i.e., the support base 14.

The plasma processing apparatus 10 further includes a shower head 38 in the processing chamber 12. The shower head 38 is provided at an upper area of the processing space S and has an electrode plate 40 and an electrode support 42.

The electrode plate 40 is a conductive plate of a substantially circular plate shape and serves as a first electrode (upper electrode) to which a high frequency power supply 35 for plasma generation is electrically connected via a matching unit (MU) 36. The high frequency power supply 35 applies a power of a predetermined high frequency (e.g., 27 MHz or higher) to the electrode plate 40. By applying high frequency powers from the high frequency power supplies 32 and 35 to the support base 14 and the electrode plate 40, respectively, a high frequency electric field is formed in a space between the support base 14 and the electrode plate 40, i.e., the processing space S.

A plurality of gas through holes 40h are formed in the electrode plate 40 which is supported by the electrode support 42 to be attached thereto or detached therefrom. A buffer chamber 42a is provided in the electrode support 42. The plasma processing apparatus 10 further includes a gas supply unit 44 which is connected with a gas inlet opening 25 of the buffer chamber 42a through a gas supply line 46. The gas supply unit 44 supplies a processing gas into the processing space S. The gas supply unit 44 may supply, e.g., CF-based etching gas or the like. The electrode support 42 is provided with a plurality of holes which are respectively connected with the plurality of gas through holes 40h and communicate with the buffer chamber 42a. Accordingly, the processing gas provided from the gas supply unit 44 is supplied into the processing space S via the buffer chamber 42a and the gas through holes 40h.

In accordance with the present embodiment, a magnetic field forming mechanism 48 which annularly or concentrically extends is provided at a ceiling portion of the processing chamber 12. The magnetic field forming mechanism 48 facilitates starting of a high frequency discharge (plasma ignition) in the processing space S to stably maintain the discharge.

In accordance with the present embodiment, an electrostatic chuck 50 is provided above the top surface of the support base 14 via an adhesive 90. The electrostatic chuck 50 is substantially formed in a circular plate shape and a cylindrical protrusion is formed at a central area of the circular plate thereof. A wafer W and focus ring 18 are mounted on the top surface of the electrostatic chuck 50. The electrostatic chuck 50 includes an electrode 52 and a pair of insulating films 54a and 54b. Each of the insulating films 54a and 54b is made of an insulator such as ceramic or the like. The electrode 52 is a conductive film disposed between the insulating films 54a and 54b to which a DC power supply 56 is connected via a switch SW. When a DC power is applied from the DC power supply 56 to the electrode 52, a coulomb force is generated to thereby adsorptively support the wafer W on the top surface of the electrostatic chuck 50. Heaters 91a to 91c as heating elements are provided in the electrostatic chuck 50 or at the bottom surface thereof. The heaters 91a to 91c are connected with a heater power supply 92 through wiring, and the focus ring 18 and the wafer W mounted on the top surface of the electrostatic chuck 50 are heated at predetermined temperatures by the heaters 91a to 91c. The focus ring 18 is made of, e.g., silicon or quartz. The support base 14 and the electrostatic chuck 50 configure a mounting table 70.

In accordance with the present embodiment, the plasma processing apparatus 10 further includes gas supply lines 58 and 60, and heat transfer gas supply units 62 and 64. The heat transfer gas supply unit 62 is connected with the gas supply line 58 which extends to the top surface of the electrostatic chuck 50 and is formed in a ring shape in a central portion of the top surface. The heat transfer gas supply unit 62 supplies a heat transfer gas, e.g., He gas, between the top surface of the electrostatic chuck 50 and the wafer W. Further, the heat transfer gas supply unit 64 is connected with a gas supply line 60 which extends to the top surface of the electrostatic chuck 50 and is formed in a ring shape to surround the gas supply line 58 in the top surface. The heat transfer gas supply unit 64 supplies a heat transfer gas, e.g., He gas, between the top surface of the electrostatic chuck 50 and the wafer W.

In the present embodiment, the plasma processing apparatus 10 further includes a controller 66. The controller 66 is connected to the gas exhaust unit 26, the switch SW, the high frequency power supply 32, the matching unit 34, the high frequency power supply 35, the matching unit 36, the gas supply unit 44 and the heat transfer gas supply units 62 and 64. The controller 66 transmits control signals to the gas exhaust unit 26, the switch SW, the high frequency power supply 32, the matching unit 34, the high frequency power supply 35, the matching unit 36, the gas supply unit 44 and the heat transfer gas supply units 62 and 64, respectively.

The control signals transmitted from the controller 66 control gas exhausting by the gas exhaust unit 26, opening/closing of the switch SW, power supply from the high frequency power supply 32, impedance matching by the supply 35, impedance control by the matching unit 36, processing gas supply from the gas supply unit 44, and heat transfer gas supplies from the heat transfer gas supply units 62 and 64. Further, the thermal conductivity of the mounting table 70 and the substrate temperature are controlled by the controller 66, which will be later described.

In the plasma processing apparatus 10, a processing gas is supplied from the gas supply unit 44 into the processing space S, wherein a high frequency electric field is formed between the electrode plate 40 and the support base 14. Thus, a plasma is generated in the processing space S and the wafer W is etched by radicals of elements or the like (e.g., oxygen radicals) in the processing gas.

Figure 2:
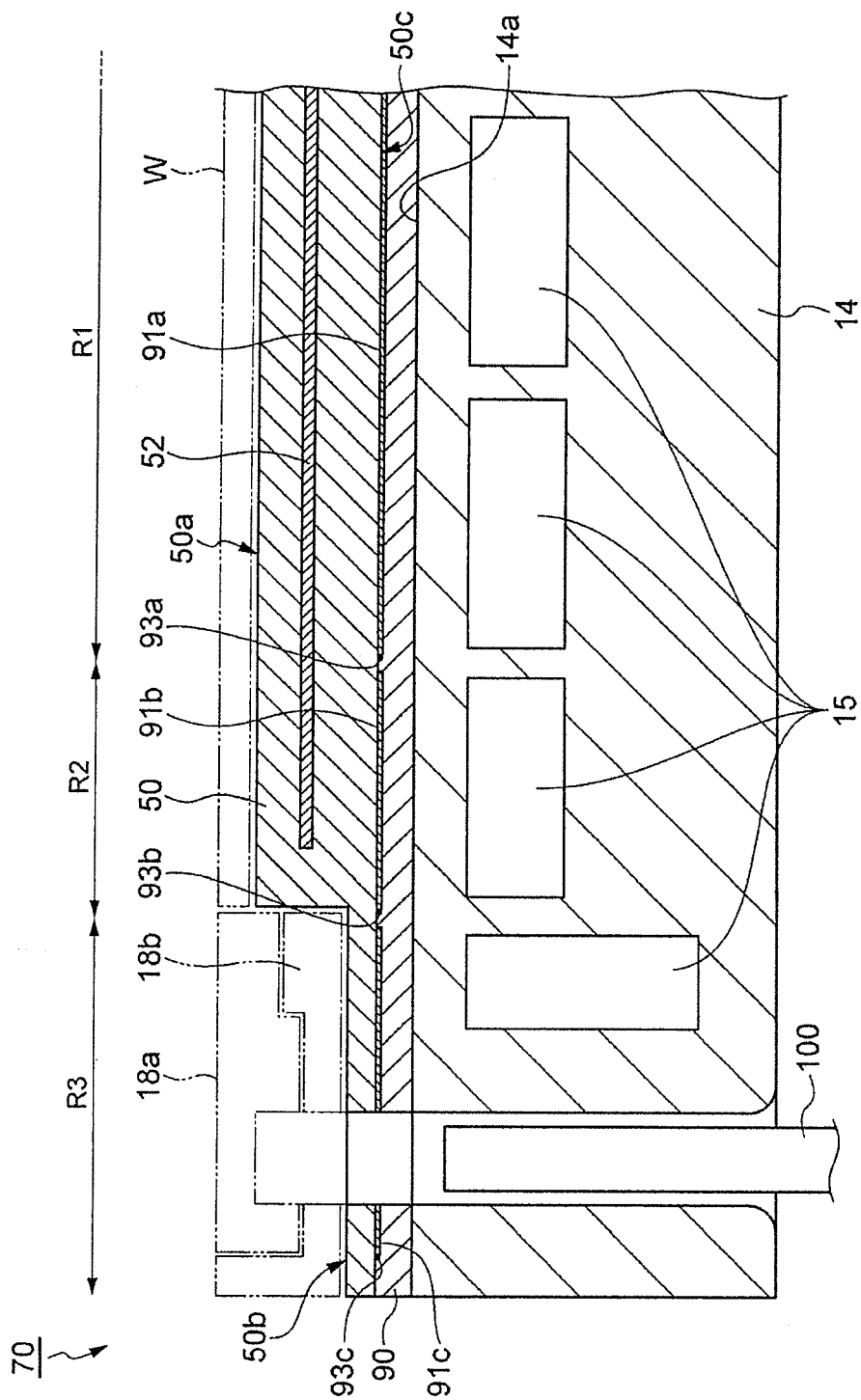
FIG. 2 is an enlarged cross-sectional view of parts of an electrostatic chuck and a support base shown in FIG. 1.

The structure of the mounting table 70 is now described in detail. FIG. 2 is an enlarged cross-sectional view of a part of the mounting table 70 shown in FIG. 1. As shown in FIG. 2, the coolant channel 15 is formed in the support base 14. The coolant channel 15 is a circulation channel and revolves in a vortex shape along a whole top surface 14a of the support base 14 when it is seen from the top surface 14a. The channel 15 has substantially identical rectangular cross sections, and the areas of the cross sections of the channel 15 are practically the same through the entire passageway of the channel 15.

The electrostatic chuck 50 is mounted on the top surface 14a of the support base 14 via the adhesive 90. The electrode 52 is provided in the protrusion of the electrostatic chuck 50, and the top surface of the cylindrical protrusion is a substrate supporting surface 50a. Further, an annular top surface around the substrate supporting surface 50a is a focus ring supporting surface 50b for mounting the focus ring 18.

The heater 91a is attached to a bottom surface 50c of the electrostatic chuck 50 at a position below a central region R1 of the substrate supporting surface 50a. Further, the heater 91b is attached to the bottom surface 50c of the electrostatic chuck 50 at a position below an edge region R2 of the substrate supporting surface 50a. Furthermore, the heater 91c is attached to the bottom surface 50c of the electrostatic chuck 50 at a position below the focus ring supporting surface 50b (region R3). The heaters 91a to 91c may be arranged in the electrostatic chuck 50. Moreover, temperature sensors 93a to 93c are provided in the vicinity of the heaters 91a to 91c. The temperature sensors 93a to 93c are connected to the controller 66 so that heating temperatures of the heaters 91a to 91c can be monitored.

Figure 3:
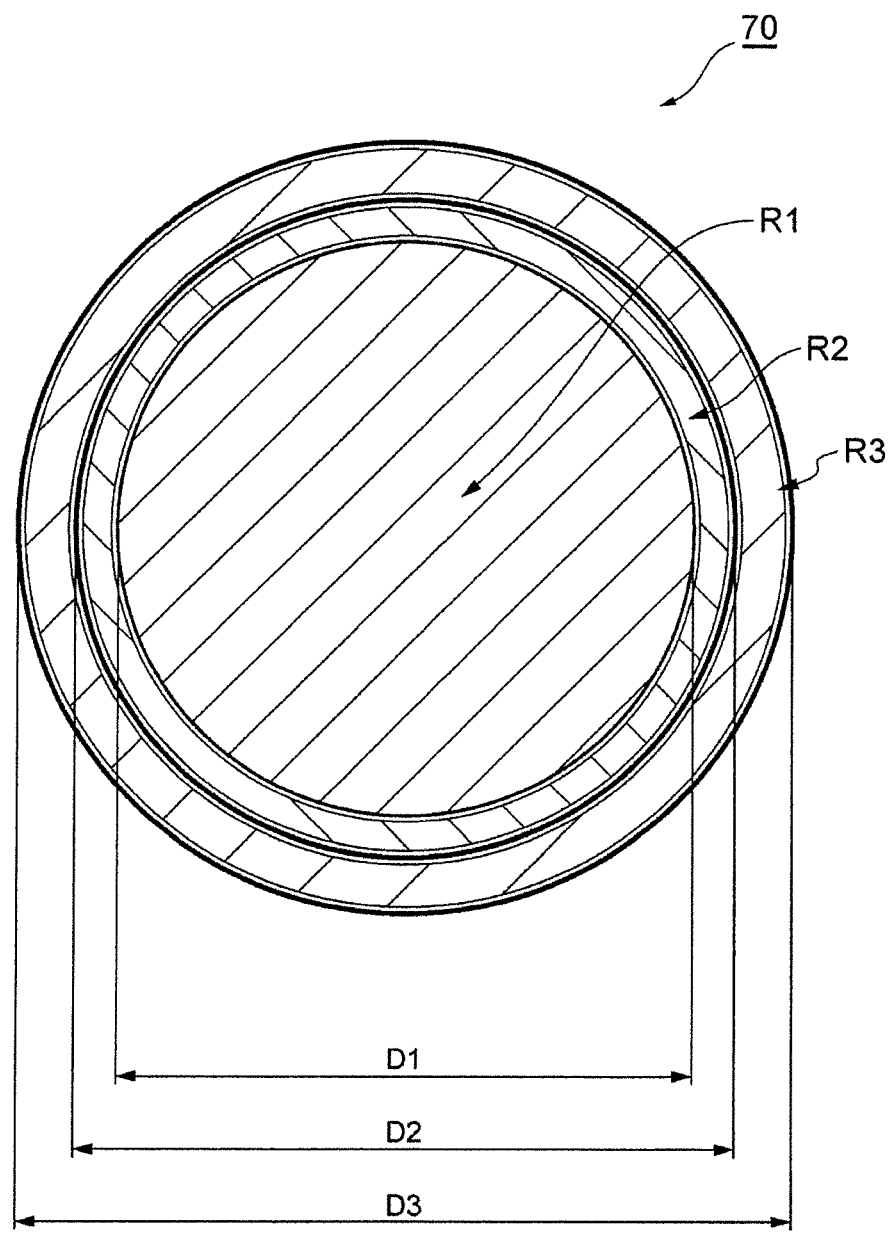
FIG. 3 is a schematic view illustrating temperature control areas by heaters shown in FIG. 2.

FIG. 3 is a plan view of the mounting table 70 for explaining a temperature control areas of respective heaters 91a to 91c. As shown in FIG. 3, the temperatures of the central region R1 of the substrate supporting surface 50a, the edge region R2 of the substrate supporting surface 50a, and the focus ring supporting surface 50b (region R3) are controlled by the heaters 91a to 91c, respectively. The outer diameter D1 of the central region R1, the outer diameter D2 of the edge region R2 and the outer diameter D3 of the focus ring supporting surface 50b (region R3) are, e.g., about 260 mm, 300 mm and 350 mm, respectively.

A through hole penetrating through the electrostatic chuck 50 and the support base 14 is formed in the focus ring supporting surface 50b, and a lift pin 100 is inserted in the through hole. The lift pin 100 is used in exchange of the focus ring 18, which includes an upper ring member 18a and a lower ring member 18b. The upper ring member 18a is formed in an annular shape and is disposed to surround the wafer W supported on the substrate supporting surface 50a. The height of the top surface of the upper ring member 18a is substantially same as that of the top surface of the wafer W. The lower ring member 18b has a ring shape corresponding to the upper ring member 18a. The lower ring member 18b has a through hole vertically extending at a position corresponding to the through hole of the lift pin 100. When the lift pin 100 moves upward, the leading end of the lift pin 100 pushes up a top surface of a hole portion of the upper ring member 18a, whereby the upper ring member 18a is lifted.

Figure 4A:
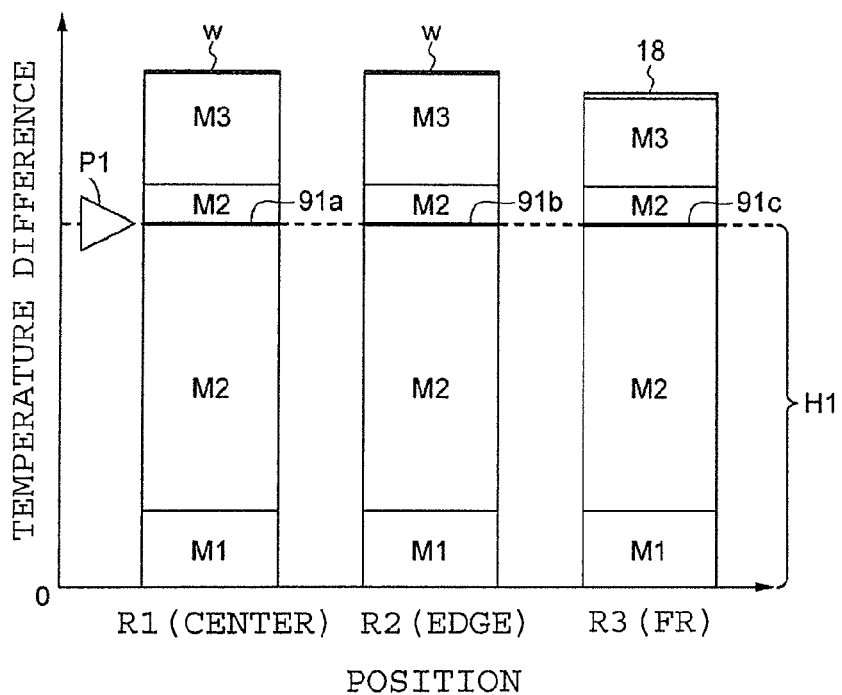
Figure 4B:
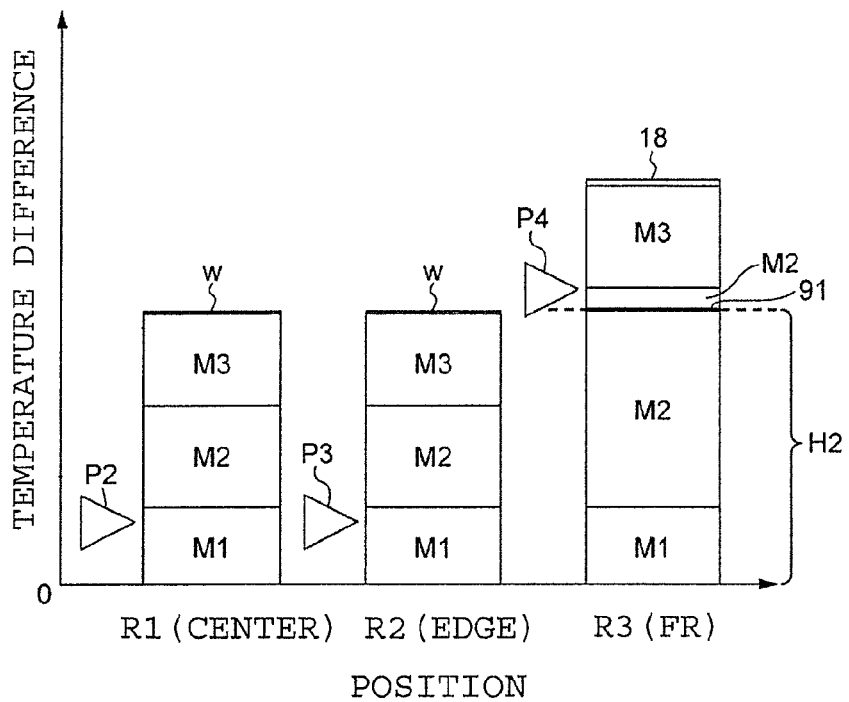

In the mounting table 70, lower structures of the substrate supporting surface 50a and the focus ring supporting surface 50b and temperature control functions thereof are substantially same, and thus, an identical temperature control function can be individually controlled throughout the entire surfaces of the substrate supporting surface 50a and the focus ring supporting surface 50b. FIGS. 4A and 4B show dependences of temperature differences on locations in the mounting table 70. In FIGS. 4A and 4B, temperature difference between the wafer W or the focus ring 18 and the coolant in each of the central region R1, the edge region R2 and the focus ring region R3 is presented in bar graph. In the drawings, M1, M2, and M3 respectively present thermal conductivities of the support base, the adhesive and a member (electrostatic chuck) configuring the supporting surface of the wafer W or the focus ring 18. The thermal conductivity is a heat transfer amount per a unit area, a unit temperature and a unit time (W/m$^2$·K). Triangles P1 to P4 are temperature monitoring points.

In the mounting table of the prior art, individual temperature control functions are provided for the respective areas of the wafer W and the focus ring 18 because temperature control ranges required in the wafer W and focus ring 18 are different. For example, as shown in FIG. 4B, only the focus ring 18 has a heater 91. That is, the substrate supporting surface 50a and the focus ring supporting surface 50b have different lower structures and the temperature monitoring points thereof are also positioned in different ways. Thus, it is difficult to control the temperatures of the substrate supporting surface 50a and the focus ring supporting surface 50b at the same level, and therefore, temperature differences caused therebtween may affect the temperature of the wafer edge region. Further, even in a case where a heater is put into the lower portion of the substrate supporting surface 50a and the temperature monitoring points thereof are aligned with the position of the point P4, members in a range H2 (i.e., members determining thermal conductivity which affects a temperature control range of heater) are different, and thus, an identical temperature control with respect to the areas of the substrate supporting surface 50a and the focus ring supporting surface 50b cannot be executed.

On the other hand, in the mounting table 70 shown in FIG. 1, as shown in FIG. 4A, the substrate supporting surface 50a and the focus ring supporting surface 50b have the same lower structure (thickness structure). Since members in a range H1 (i.e., members determining thermal conductivity which affects the temperature control range of heater) are the same, the identical temperature control function can be controlled in the entire surfaces of the substrate supporting surface 50a and the focus ring supporting surface 50b, individually.

Figure 5:
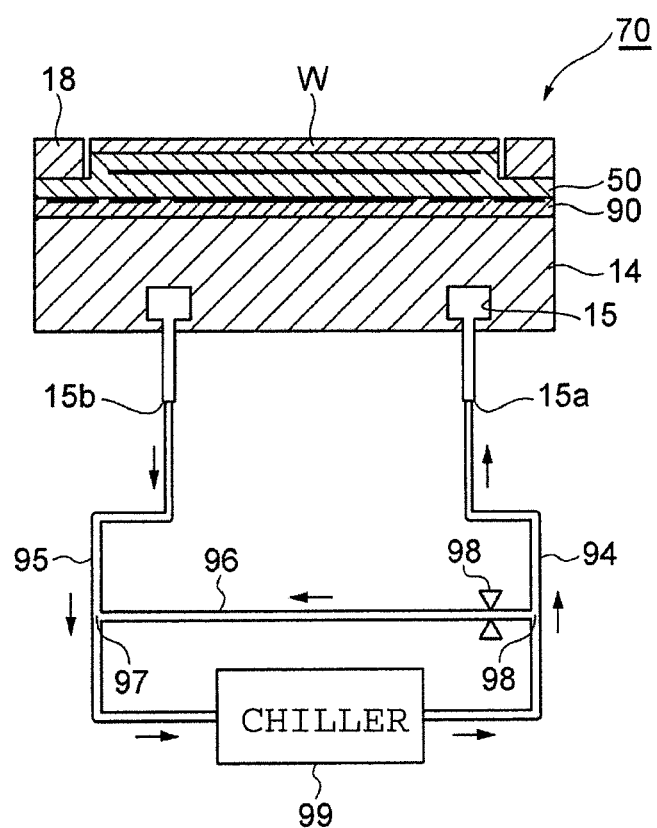
FIG. 5 is a schematic view showing a cooling system connected to a cooling channel.

Next, a cooling system connected to the coolant channel 15 in the support base 14 is described. FIG. 5 shows a schematic view of the cooling system. As shown in FIG. 5, since the coolant channel 15 is provided in the support base 14 and a coolant is supplied into the channel 15 from the cooling system, heat is taken away from the top surface of the support base 14. The cooling system includes a chiller 99, a first channel 94, a second channel 95, a bypass channel 96 and a flow rate control valve 98. The chiller 99 has a main body for controlling the temperature of the coolant and a pump for transferring the coolant. The pump may transfer the coolant at a first flow rate as a constant flow rate. The constant flow rate is a rated flow rate of, e.g., 20 (l/min). The first channel 94 connects the chiller 99 and an entrance 15a of the channel 15, and the second channel 95 connects the chiller 99 and an exit 15b of the channel 15. The bypass channel 96 branches from a point at midway of the channel 94 and is connected to a point at a midway of the second channel 95. The opening/closing degree of the flow rate control valve 98 is controlled to control the flow rate of the coolant entering the bypass channel 96. Since the chiller 99 and the flow rate control valve 98 are connected to the controller 66, the controller 66 controls the flow rate of the coolant entering the bypass channel 96.

When the flow rate control valve 98 is closed, the coolant of the first flow rate released from the chiller 99 is supplied into the channel 15 via the first channel 94. Then, the coolant passes through the channel 15 and is returned to the chiller 99 via the second channel 95. Alternatively, when the flow rate control valve 98 is opened to make a coolant of a specific amount flow therethrough, a stream of the coolant enters the bypass channel 96 and is returned to the chiller 99 without circulating through the cooling channel 15. At this time, the flow rate of the coolant supplied into the cooling channel 15 becomes a second flow rate smaller than the first flow rate. When the flow rate of the coolant supplied from the chiller 99 is simply reduced, the cooling capacity, i.e., the amount of heat W taken away per unit time may be also reduced. By using the bypass channel 96, the amount of the coolant supplied into the channel 15 can be reduced while maintaining the rated flow rate of the chiller 99.

As described above, when the amount of the coolant supplied into the cooling channel 15 is controlled, the thermal conductivity of the mounting table 70 can be changed. Hereinafter, detailed description thereof is made. The coolant flowing through the channel 15 in the support base 14 is an inviscid flow (mainstream); however, the coolant in the vicinity of the inner wall of the channel 15 (i.e., boundary layer of the coolant contacting with the inner wall) is a viscid flow which has a viscous resistance. That is, a flow velocity of the coolant at an interface between the inner wall and the coolant is zero, and as it gets closer to the mainstream, the flow velocity of the coolant becomes closer to the flow velocity of the mainstream. The thickness of the boundary layer depends on the difference of the flow velocities at the mainstream and the inner wall.

In other words, the thickness of the boundary layer tends to be thinner when the flow velocity of the mainstream gets faster, and the thickness of the boundary layer can be presented as a function of the flow velocity. The flow velocity is determined by a cross section area of the channel 15 and the flow rate. Therefore, when the flow rate is changed under a constant cross section area, the flow velocity is changed and the thickness of the boundary layer is also changed. Moreover, the thickness of the boundary layer affects the thermal conductivity. As the thickness of the boundary layer gets thicker, the thermal conductivity becomes lower (i.e., the heat transferring gets further difficult). Therefore, the thermal conductivity of the mounting table 70 can be changed by changing the flow rate of the coolant.

The temperature control ranges of the heaters 91a to 91c can be controlled by changing the thermal conductivity of the mounting table 70. Hereinafter, a control for temperature control ranges of the heaters by changing the thermal conductivity is described. First, a relationship between the thermal conductivity and the wafer temperature (substrate temperature) is explained.

Figure 6:
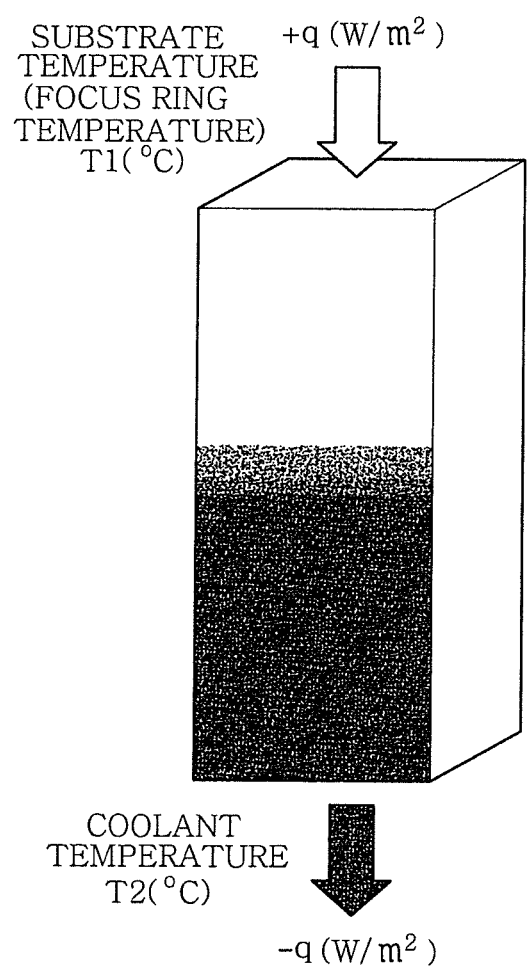
FIG. 6 is a schematic view presenting a temperature difference between a substrate temperature and a coolant temperature.

Since a relationship between the thermal conductivity and the temperature of the focus ring 18 is the same as that between the thermal conductivity and the wafer temperature, description will be made only on the wafer temperature. FIG. 6 is a schematic view presenting a temperature difference $\Delta T$ between the substrate temperature T1 and a coolant temperature T2. As shown in FIG. 6, when an amount of an applied heat to the wafer W per unit area is defined as +q (W/m$^2$) and a thermal resistance per unit area between the wafer W and a coolant is defined as R (a reciprocal of thermal conductivity $\kappa$ (W/m$^2$·K)), $\Delta T = q \cdot R = q/K$. That is, if the thermal conductivity $\kappa$ and the applied heat q are determined, the temperature difference $\Delta T$ between the substrate temperature T1 and the coolant temperature T2 can be obtained.

Herein, the applied heat q becomes, empirically, a half of the total power W of the high frequency powers 32 and 35. Further, the thermal conductivity $\kappa$ is determined by the material of the mounting table 70. Therefore, the temperature difference $\Delta T$ can be obtained by determining the thermal conductivity $\kappa$ and the powers applied during plasma processing. Further, the substrate temperature T1 is obtained by adding the coolant temperature T2 to the temperature difference $\Delta T$.

Figure 7:
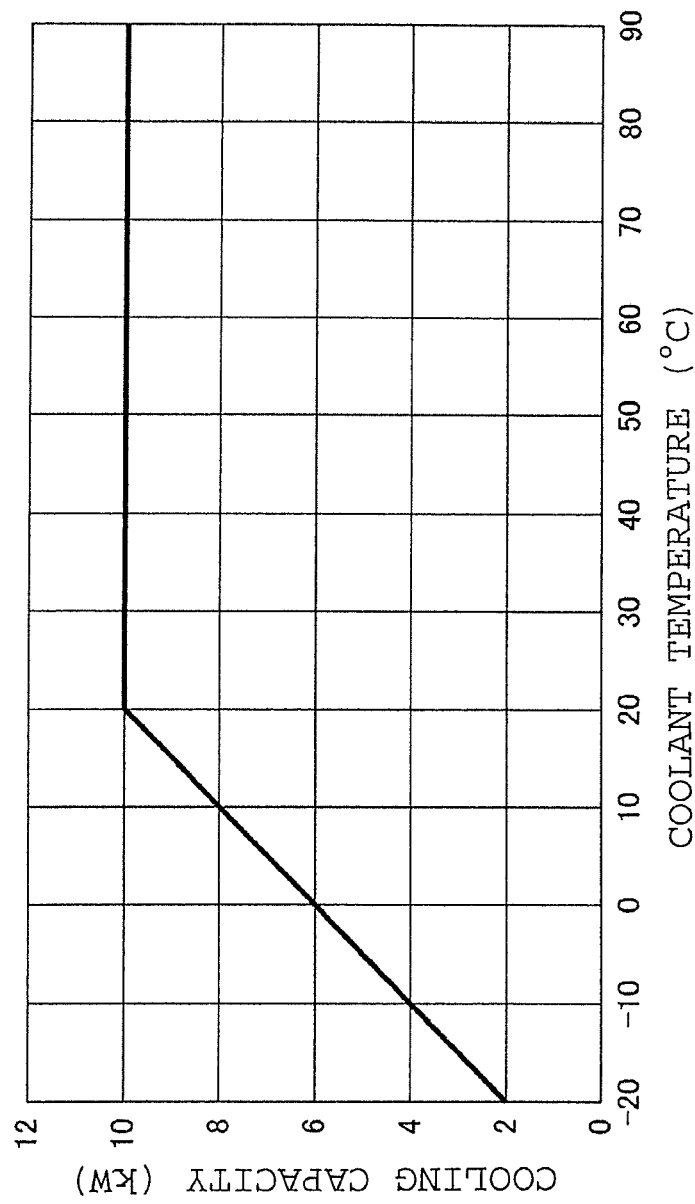
FIG. 7 is a graph showing a cooling capacity of a general chiller.

Moreover, the substrate temperature T1 is limited by a physical property of the mounting table 70. For example, the substrate temperature T1 cannot be increased more than the heat resistant temperature of the adhesive 90. Further, the cooling capacity of the chiller 99 tends to deteriorate when the coolant temperature T2 is lower than a specific coolant temperature. FIG. 7 shows an example of cooling capacity with respect to a coolant temperature. As shown in FIG. 7, the cooling capacity has a constant value when the coolant temperature T2 is equal to or higher than 20° C., but it linearly decreases when the coolant temperature T2 is lower than 20° C. The cooling capacity shown in FIG. 7 is only an example, and the position of the inflection point is not limited at 20° C.

In order to control the temperature by using the cooling system, the amount of heat applied to the substrate cannot be more than that allowed by the cooling capacity of the cooling system. That is, when the substrate temperature T1 is controlled, a cooling capacity limit of the chiller 99 needs to be considered as well as the limit of the thermal resistant temperature of the adhesive 90.

Figure 8:
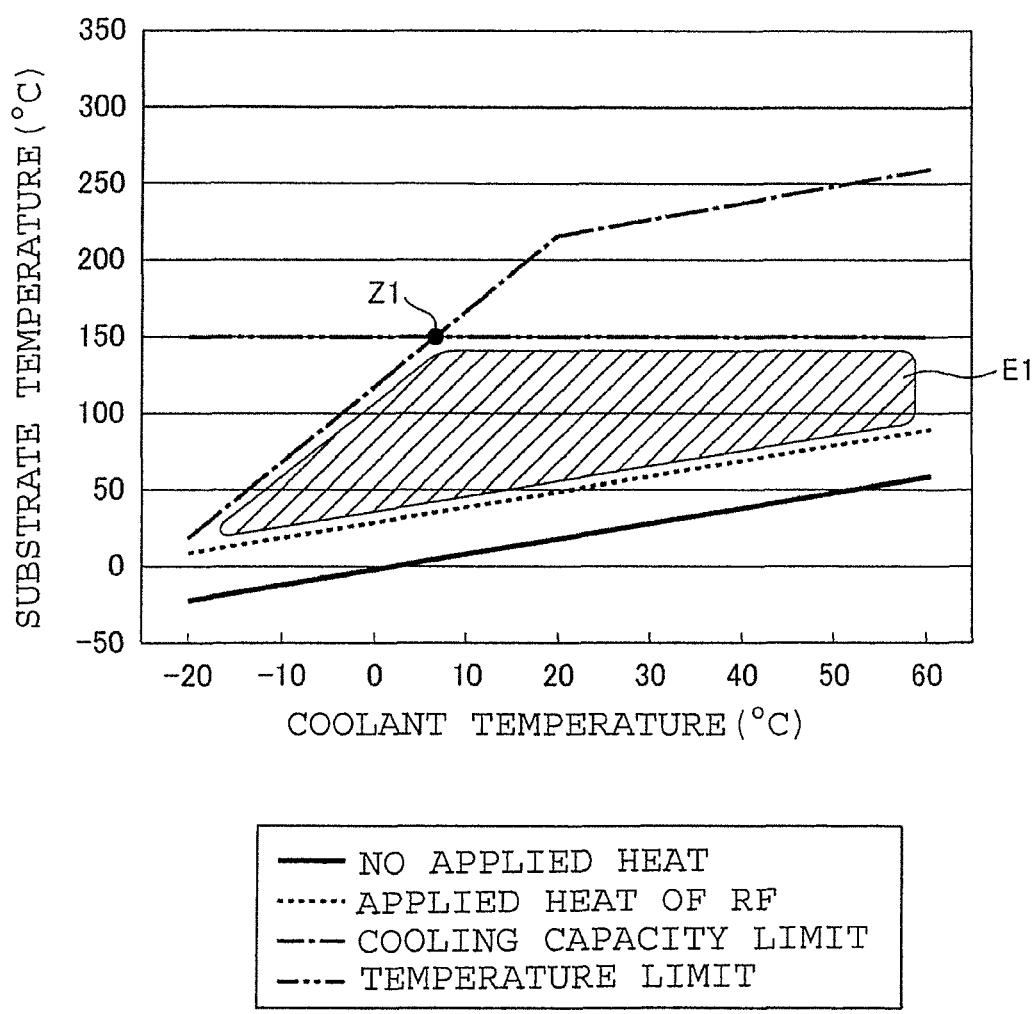
FIG. 8 is a graph illustrating a temperature control range of the heater.

FIG. 8 is a graph for showing the temperature control range of a heater when the thermal conductivity $\kappa$ of the mounting table 70 is set to 500 W/m$^2$·K. The horizontal axis and the vertical axis in FIG. 8 denote a coolant temperature and a substrate temperature, respectively. When the amount of applied heat is 0 W, the temperature difference $\Delta T$ can be obtained only with the thermal conductivity $\kappa$. The solid line in the graph presents a substrate temperature with respect to a coolant temperature when no heat is applied (q=0). Meanwhile, when the amount of applied heat q has a specific value, the temperature difference $\Delta T$ can be obtained by using the equation of $\Delta T = q/K$. The dotted line in the graph presents the substrate temperature with respect to the coolant temperature when a heat is applied from plasma (herein, q=1,500 W). The applied heat from the plasma is not limited to 1,500 W, and it may be changed depending on processing conditions.

Further, a maximum value of the cooling capacity of the cooling system becomes a limit for the amount of the applied heat. Herein, the amount of the applied heat includes an applied heat from the heater as well as the applied heat from the plasma. For example, when it is assumed that the cooling capacity of the chiller 99 corresponds with that shown in FIG. 7, an alternated long and short dash line in the graph becomes the limit of cooling capacity, i.e., the maximum substrate temperature to be cooled with the cooling capacity shown in FIG. 7. Further, the alternated long and two short dashes line presents the heat resistant temperature of the adhesive 90, which is, e.g., 150° C., herein.

Since the temperature limits described above exist, a temperature range lower than the alternated long and short dash line and the alternated long and two short dashes line in the graph and higher than the solid line in the graph becomes a temperature range in which heat is applied from the heater, i.e., the temperature control range of the heater. The temperature control range of the heater becomes a temperature range (E1 in drawing) which is lower than the alternated long and short dash line and the alternated long and two short dashes line in the graph but higher than the dotted line in the graph when the applied heat from the plasma (i.e. applied heat of RF power) exists. In a temperature control status in which a small amount of power is applied to the heater (heating operation by the heater), the lower limit value is determined as in the case when the applied heat from the plasma exists.

Figure 9A:
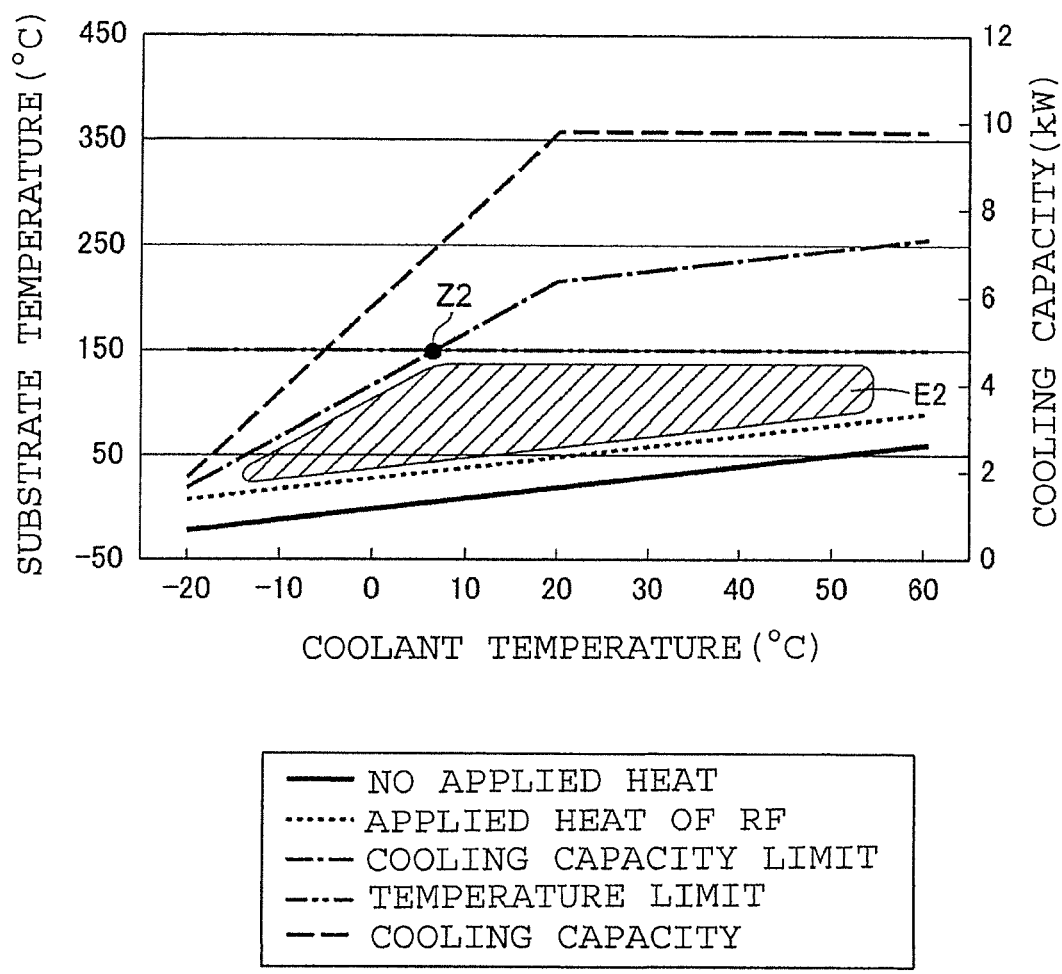

As shown in FIG. 8, when the coolant temperature is equal to or lower than the temperature Z1 (herein, e.g., 5° C.) in the case where the mounting table 70, of which thermal conductivity is 500 (W/m$^2$·K), is used, the temperature limit of the cooling capacity becomes lower than the heat resistant temperature of the adhesive 90. FIG. 9A is a graph made by adding the cooling capacity shown in FIG. 7 to the graph in FIG. 8. In a case where an inflection point in the cooling capacity of the chiller 99 (i.e., a saturation temperature in the cooling capacity) exists, as shown in FIG. 9A, the temperature limit of the cooling capacity and the heat resistant temperature of the adhesive 90 changes over at a temperature equal to or lower than Z2 (herein, e.g., 5° C.), when the coolant temperature is controlled to be in a range lower than the inflection point. Therefore, the temperature control range of heater becomes a range E2.

Figure 9B:
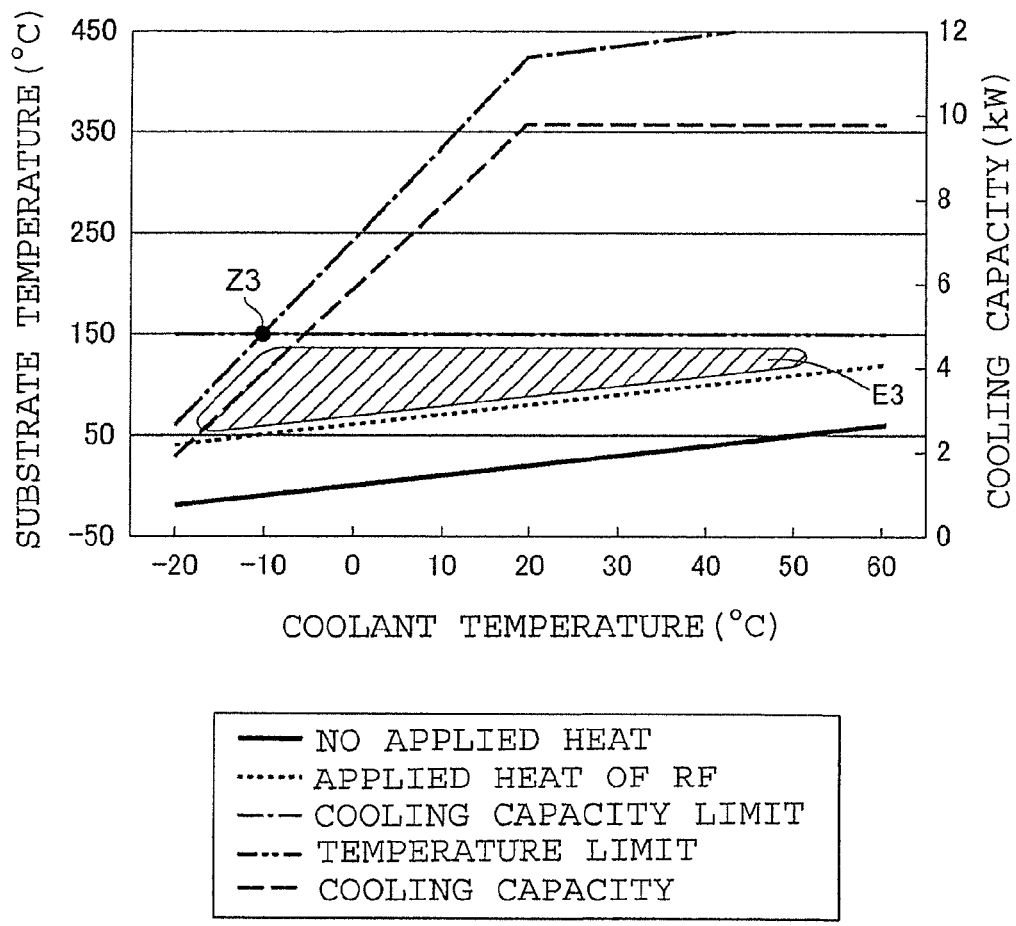

Alternatively, when the thermal conductivity κ is set to be small, (e.g., the thermal conductivity is changed from a first thermal conductivity to a second thermal conductivity which is smaller than the first thermal conductivity), the coolant temperature, at which the temperature limit of cooling capacity and the heat resistant temperature of the adhesive 90 changes over, can be further lowered. FIG. 9B shows a temperature control range of the heater when the thermal conductivity κ of the mounting table 70 is set to 240 (W/m$^2$·K). The other conditions are the same as those in FIG. 8. As shown in FIG. 9B, in the mounting table 70 of which thermal conductivity κ is 240 (W/m$^2$·K), a coolant temperature Z3, at which the temperature limit of cooling capacity and the heat resistant temperature of the adhesive 90 changes over, is about −12° C. Accordingly, the temperature control range of the heater becomes a range E3. That is, in the case when the mounting table 70 has small thermal conductivity κ, temperature control can be conducted by using a heater even at a relatively low coolant temperature.

Figure 10:
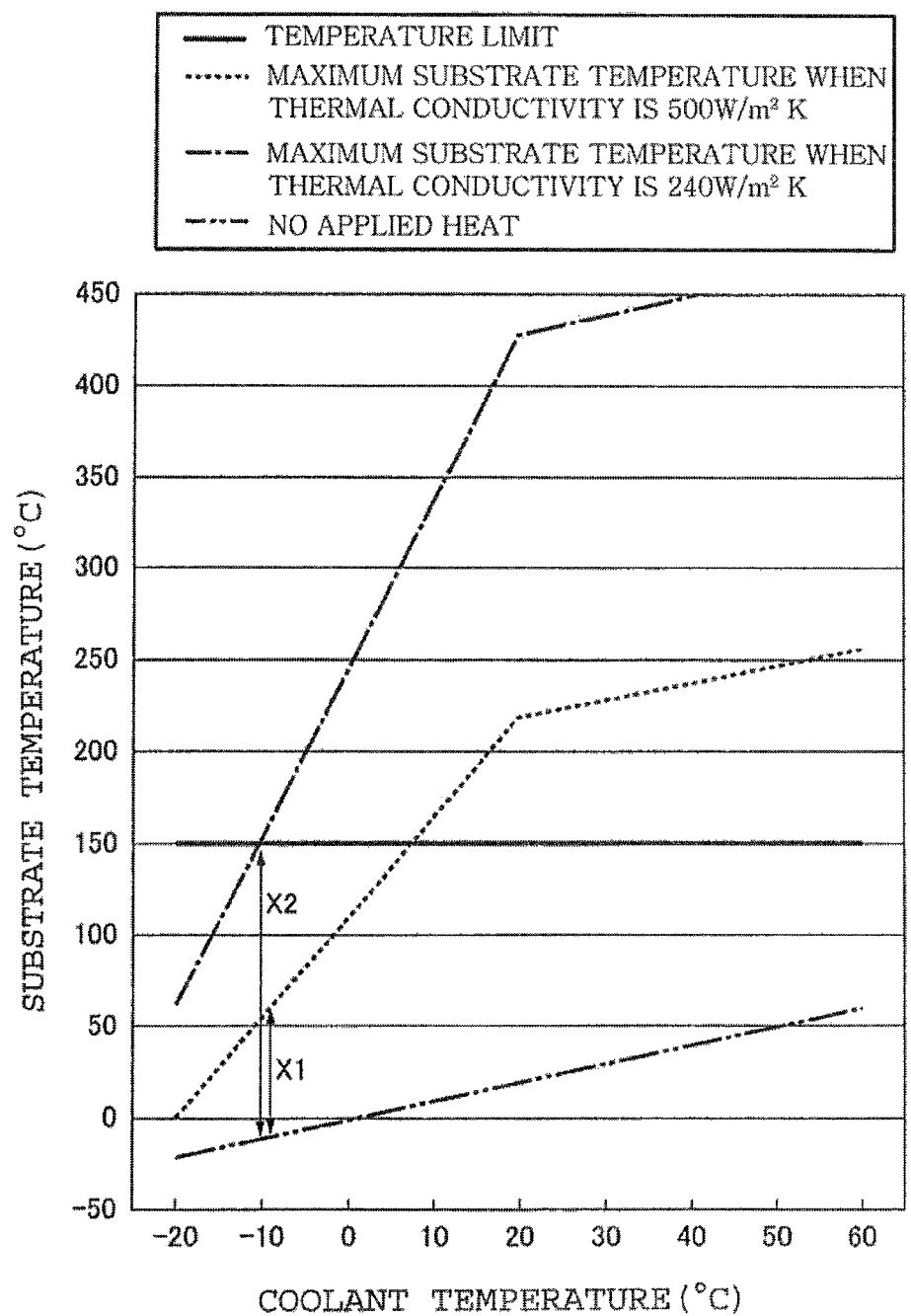
FIG. 10 is a comparative graph of the temperature control ranges of the heater in respective cases when the mounting table of which thermal conductivity is 500 $(W/m^2 \cdot K)$ is used and a mounting table of which thermal conductivity is 240 $(W/m^2 \cdot K)$ is used.

FIG. 10 is a graph made by overlapping a part of the graph shown in FIG. 9A and a part of the graph shown in FIG. 9B. By referring to FIG. 10, a maximum substrate temperature at the mounting table 70 of which thermal conductivity κ is 240 W/m$^2$·K is compared with a maximum substrate temperature at the mounting table 70 of which thermal conductivity κ is 500 W/m$^2$·K. For example, the comparison is conducted at a coolant temperature of about −10° C. When the coolant temperature is −10° C., the maximum substrate temperature at the mounting table 70 of which thermal conductivity κ is 500 W/m$^2$·K is about 55° C., and thus, a temperature control range X1 of the heater becomes a range from about −5° C. to 55° C. Alternatively, since the maximum substrate temperature at the mounting table 70 of which thermal conductivity κ is 240 W/m$^2$·K is about 150° C., a temperature control range X2 of the heater becomes a range from about −5° C. to 150° C. As described above, if the thermal conductivities κ are different, upper limits in the temperature control ranges of the heater become different, and therefore, the temperature control ranges of the heater are also greatly different.

As shown in FIGS. 9A and 9B, when an applied heat from a plasma exists as denoted with the dotted lines or when the heating operation is performed by the heater, the substrate temperature rises as the thermal conductivity κ becomes lower, and thus, the lower limit in the temperature control range E3 of the heater is greater than that in the temperature control range E2 of the heater. That is, when it is desired to lower the lower limit in the temperature control range of the heater, it is preferable to apply the mounting table of a relatively higher thermal conductivity κ.

Figure 11:
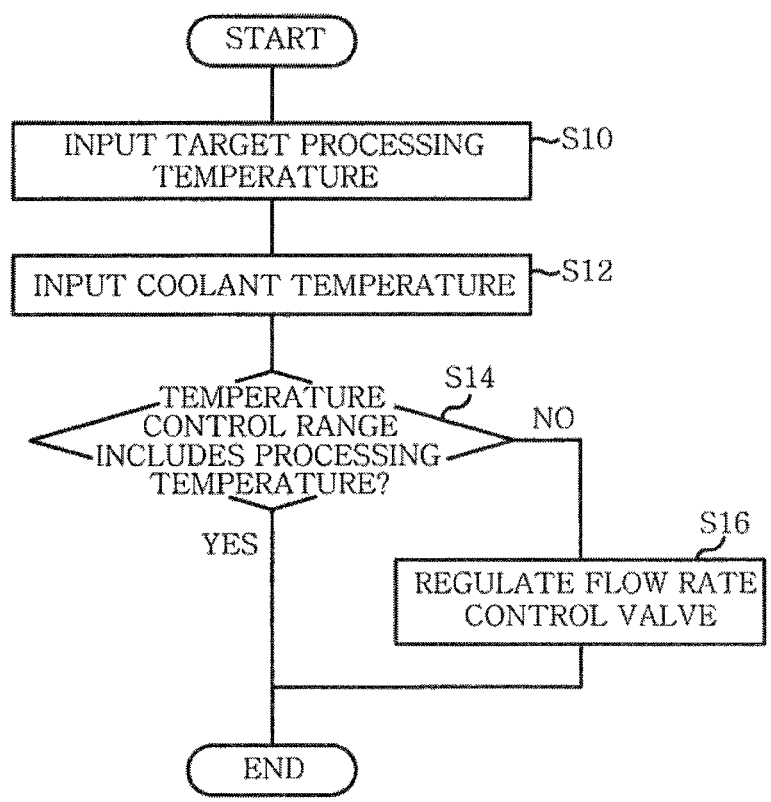
FIG. 11 is a flowchart showing a method of changing a substrate temperature setting region.

As described above, the thermal conductivity of the mounting table 70 can be changed by controlling the amount of coolant supplied into the cooling channel 15. Therefore, the temperature control range of the heater can be changed by controlling the amount of coolant, when it is necessary. FIG. 11 is a flowchart for describing a method of changing the temperature control range of the heater. The control processing in FIG. 11 is executed, e.g., before a specific process by the controller 66.

Further, it is assumed that the thermal conductivity κ of the mounting table 70 when the flow rate control valve 98 is closed is already known.

First, as shown in FIG. 11, the controller 66 inputs recipes in step S10. In step S10, the controller 66 inputs the recipes recorded in a storage medium connected thereto and inputs, e.g., a target substrate temperature of wafer W or a target processing temperature, and a power to be applied in a process. Alternatively, those values may be directly inputted by a user's operation. Then, the controller 66 inputs the coolant temperature in step S12. In step S12, a set temperature of the coolant is inputted from, e.g., the chiller 99. Next, the controller 66 determines whether or not a temperature control range of the heater includes the processing temperature in step S14. That is, it is determined whether or not the processing temperature inputted in step S10 is included in the temperature control range of the heater at the coolant temperature set in step S12.

If it is determined that the temperature control range of the heater includes the processing temperature in step S14, the control processing in FIG. 11 is completed. Otherwise, the flow rate control valve 98 is adjusted in step S16. For example, the controller 66 lowers the thermal conductivity κ by controlling the flow rate control valve 98 to be opened and allows the upper limit in the temperature control range of the heater to be higher, thereby making the processing temperature inputted in step S10 be included in the temperature control range of the heater. After step S16, the control processing in FIG. 11 is completed. With this, the substrate temperature setting region is changed by changing the thermal conductivity κ of the mounting table 70, and the temperature control for the substrate is possible by the heater before executing a process.

Figure 12:
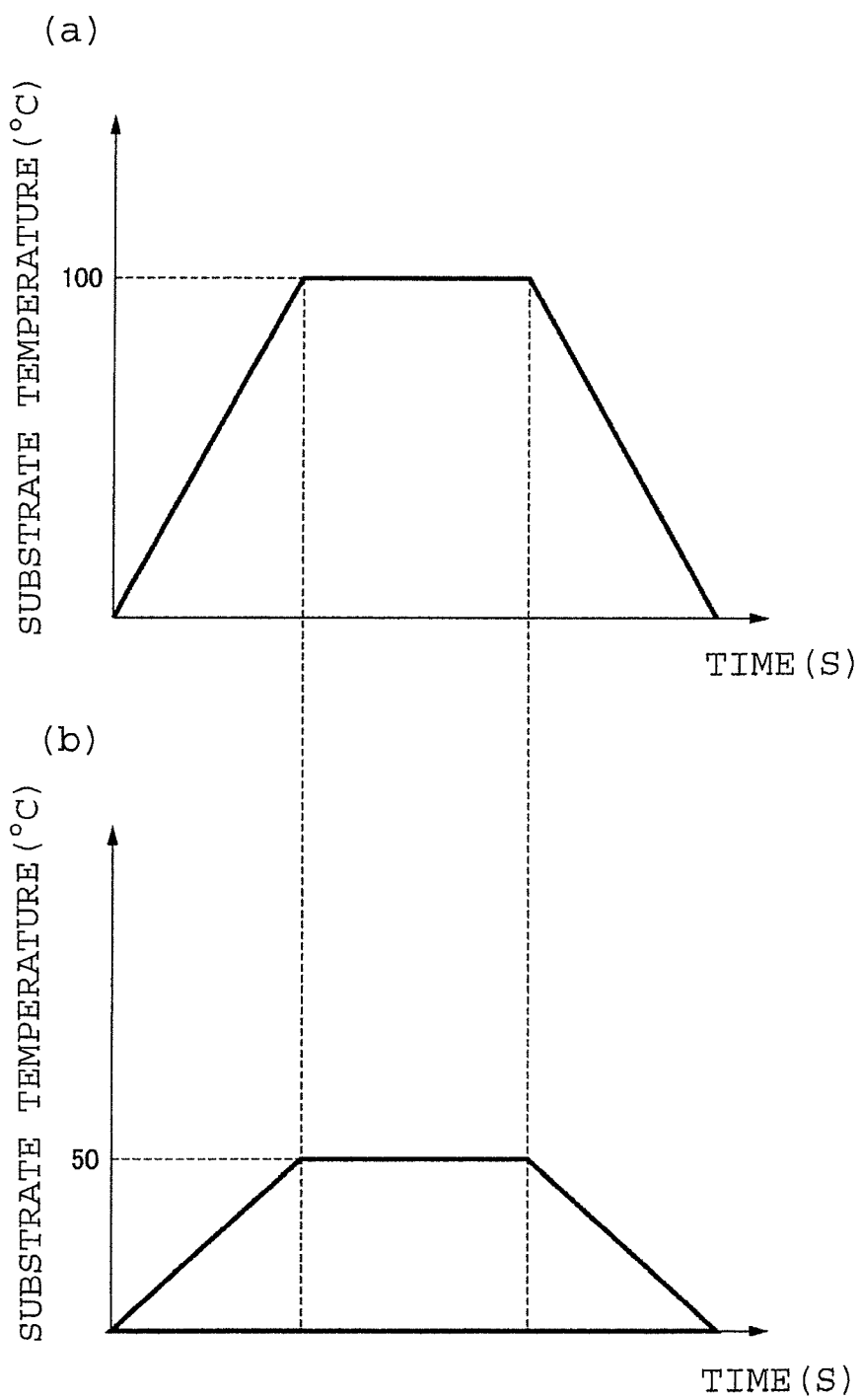
FIG. 12 shows a substrate temperature dependence on time in a first RF device ((a) of FIG. 12) and a substrate temperature dependence on time in a second RF device ((b) of FIG. 12)

Conventionally, in order to obtain different substrate temperatures with the same applied heat from a plasma, it has been considered that an appropriate electrostatic chuck for each substrate temperature needs to be prepared. For example, as shown in (a) and (b) of FIG. 12, in order to obtain different substrate temperatures (e.g., 50° C. and 100° C.) with a same applied heat from a plasma (with a constant power), electrostatic chucks of different thermal conductivities κ are required. However, in the substrate processing apparatus in accordance with the present embodiment, the thermal conductivity κ is controlled by adjusting the flow rate control valve 98 in the processing described in FIG. 11 so that different substrate temperatures can be obtained by using the identical mounting table 70.

Further, when shipping apparatuses, the processing in FIG. 11 may be executed. With this, even in a case where individual variations exist in the thermal conductivities of the mounting tables 70 or the electrostatic chucks 50, apparatuses in which substrate temperature setting regions by the mounting tables 70 are identical can be provided.

Figure 13:
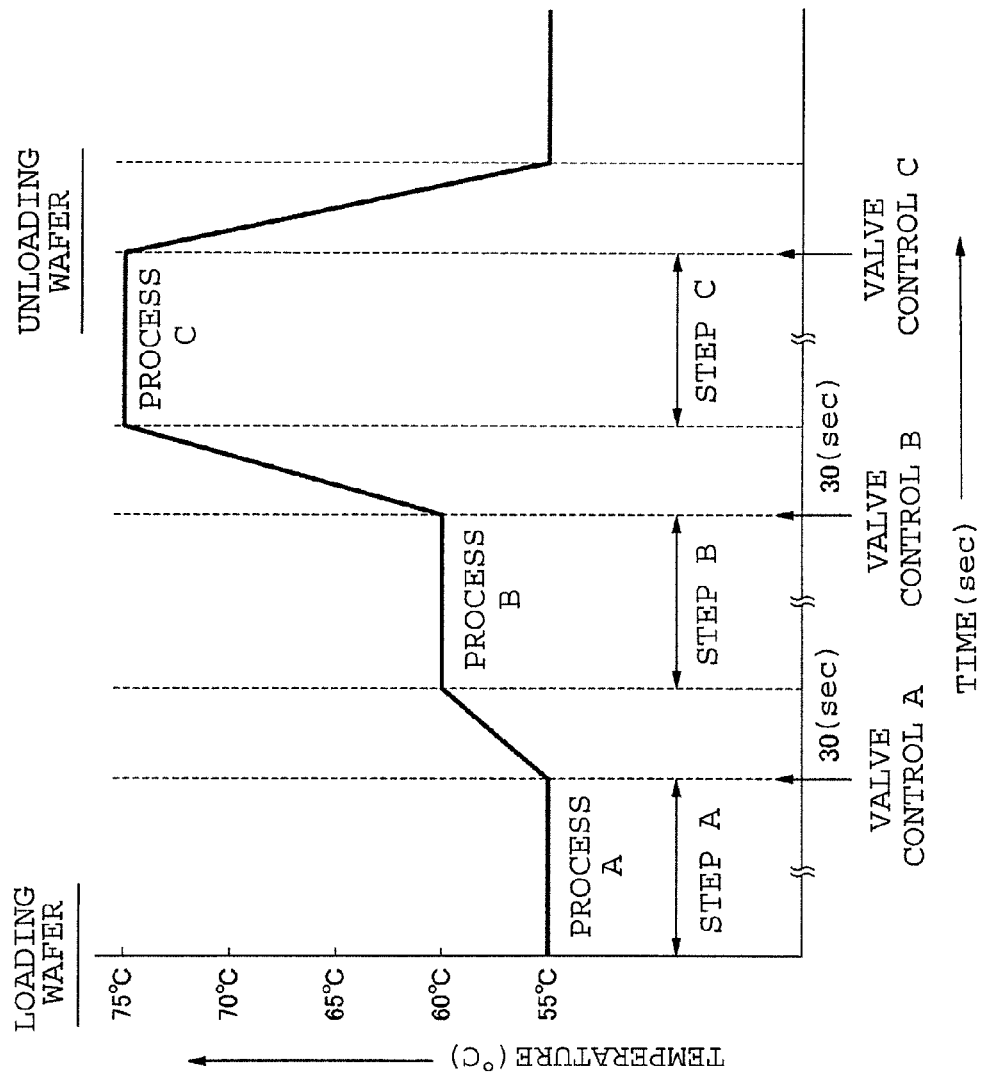
FIG. 13 is a time chart for explaining a substrate processing method.

Further, changing the thermal conductivity κ of the mounting table 70 by the valve adjustment can be executed during a process as well. FIG. 13 is an exemplary view of stepwise temperature control processes, wherein the horizontal axis and the vertical axis present a time and a substrate temperature, respectively. Three processes A to C in which target substrate temperatures are different in a period between loading and unloading a wafer W are executed. The controller 66 performs a valve control A when the process A is completed. In the valve control A, the controller 66 executes the control processing shown in FIG. 11, whereby the flow rate control valve 98 is opened to allow a processing temperature (60° C.) to be in the temperature control ranges of heaters, and the heaters 91a to 91c may be controlled by referring to temperature monitoring results from the sensors 93a to 93c.

In this case, a heat emission rate of each heater is controlled based on a control amount of the flow rate control valve 98 (i.e., the flow rate of coolant flowing into the bypass channel), the temperature monitoring results and the target temperature. Further, when the process B is completed, the controller 66 may perform a valve control B as the valve control A.

When the process C is completed, the flow rate control valve 98 may be closed (valve control C) to make the substrate temperature rapidly decrease.

Herein, when the thermal conductivity κ is set to be small, a temperature difference between the substrate temperature and the coolant temperature becomes greater (i.e., the substrate temperature increases) because a heat remains in the mounting table 70. That is, the flow rate control valve 98 is opened to increase the substrate temperature as well as to control the heater temperature control range. Accordingly, when the stepwise temperature control processes shown in FIG. 13 are performed, a suitable temperature control can be achieved by adjusting the flow rate control valve 98 without using the heaters 91A to 91C. For example, the controller 66 may control only the flow rate control valve 98 to be opened based on the monitoring results from the sensors 93a to 93c and the target temperature (in the valve controls A and B).

In the above-described substrate processing apparatus in accordance with the present embodiment, the first channel 94 connecting the chiller 99 and the entrance 15a of coolant channel 15, and the second channel 95 connecting the chiller 99 and the exit 15b of coolant channel 15 are connected with the bypass channel 96. Therefore, the flow rate of the coolant flowing through the bypass channel 96 is controlled by the flow rate control valve 98, and thus, the flow rate of the coolant flowing through the coolant channel 15 is also regulated. Since the thermal conductivity κ can be changed by regulating the flow rate of the coolant, the temperature control ranges of the heaters 91a to 91c under the heat resistant temperature of the adhesive 90 are prevented from being limited by the cooling capacity of the chiller 99 by, e.g., changing the thermal conductivity κ of the mounting table 70 to be small. Therefore, the limit to the substrate temperature control range can be extended with a simple structure.

The present invention is not limited to the above-described embodiment. For example, the flow rate control valve 98 is regulated by the controller 66; however, it may be adjusted by a worker or the like.

While the invention has been shown and described with respect to the embodiments, the present invention is not limited to the above-described embodiments and various changes and modifications may be made without departing from the scope of the invention as defined in the following claims.

What is claimed is:

1. A substrate temperature adjusting method for use with a substrate processing apparatus, wherein the substrate processing apparatus comprises:
   a processing chamber including a processing space;
   a mounting table including a support base in which a coolant channel having an entrance and an exit is provided, an electrostatic chuck attached to the support base by an adhesive, the adhesive having a heat resistant temperature and a heater disposed inside the electrostatic chuck or at a bottom surface of the electrostatic chuck, the heater having a temperature control range;
   a chiller including a main body configured to control a temperature of a coolant and a pump configured to circulate the coolant at a constant first flow rate;
   a first channel which connects the chiller and the entrance of the coolant channel;
   a second channel which connects the chiller and the exit of the coolant channel;
   a bypass channel which branches from a midway of the first channel and is connected to a midway of the second channel;
   a flow rate control valve configured to control a flow rate of the coolant flowing through the bypass channel;
   a gas supply unit configured to supply a processing gas into the processing space;
   a first electrode; and
   a power supply configured to apply a voltage between the first electrode and the support base serving as a second electrode, the processing space being formed between the first electrode and the second electrode,
   the substrate temperature adjusting method comprising:
   circulating the coolant through the coolant channel;
   determining whether a target processing temperature is included in the temperature control range of the heater, wherein an upper limit of the temperature control range is lower than the heat resistant temperature of the adhesive and lower than the maximum substrate temperature to be cooled with the cooling capacity of the chiller,
   in response to a determination that the target processing temperature is included in the temperature control range, changing a flow rate of the coolant flowing through the coolant channel from the first flow rate to a second flow rate which is smaller than the first flow rate by opening the flow rate control valve to make the coolant flow through the bypass channel at a third flow rate,
   wherein a sum of the second flow rate and the third flow rate is equal to the first flow rate.

2. The method of claim 1, wherein the main body controls the temperature of the coolant to be lower than the temperature at which the cooling capacity of the chiller is saturated.

3. A method of changing a temperature control range of a heater of a substrate processing apparatus, wherein the substrate processing apparatus comprises:
   a processing chamber including a processing space;
   a mounting table including a support base in which a coolant channel having an entrance and an exit is provided, an electrostatic chuck attached to the support base by an adhesive, the adhesive having a heat resistant temperature and a heater disposed inside the electrostatic chuck or at a bottom surface of the electrostatic chuck, the heater having a temperature control range; and
   a chiller including a main body configured to control a temperature of a coolant and a pump configured to circulate the coolant,
   the method comprising:
   circulating the coolant through the coolant channel;
   extending the temperature control range of the heater by changing the flow rate of the coolant flowing through the coolant channel from a first flow rate to a second flow rate which is smaller than the first flow rate to change a first thermal conductivity of the mounting table to a second thermal conductivity which is smaller than the first thermal conductivity,
   wherein the upper limit of the temperature control range is lower than the heat resistant temperature of the material of the adhesive.

4. The method of claim 3, wherein the main body controls the temperature of the coolant to be lower than the temperature at which the cooling capacity of the chiller is saturated.

\* \* \* \* \*